United States Patent [19]

Nakae et al.

[11] Patent Number: 4,772,304
[45] Date of Patent: Sep. 20, 1988

[54] TRANSPARENT BN-TYPE CERAMIC MATERIAL AND METHOD OF PRODUCING THE SAME

[75] Inventors: Hiroyuki Nakae, Kawasaki; Yukio Matsunami; Toshitsugu Matsuda, both of Yokohama; Toshio Hirai, 4-91, Takamori 3-chome, Izumi-shi, Miyagi, all of Japan

[73] Assignees: Research Development Corporation of Japan; Japan Metals & Chemicals Co., Ltd.; The Furukawa Electric Co., Ltd., all of Tokyo; Toshio Hirai, Izumi, all of Japan

[21] Appl. No.: 866,027

[22] Filed: May 21, 1986

[30] Foreign Application Priority Data

Oct. 4, 1985 [JP] Japan .................. 60-220389

[51] Int. Cl.$^4$ ............... C03B 19/00; C01B 21/064
[52] U.S. Cl. ..................... 65/18.2; 65/18.1; 264/81; 423/290
[58] Field of Search ............ 65/17, 18.1, 18.2; 501/97; 423/290; 427/255.2, 94; 264/81, 2.7, 2.6

[56] References Cited

U.S. PATENT DOCUMENTS 3,676,343 7/1972 Dietz .................. 501/97 X
4,319,803 3/1982 Burmeister ............ 65/3.12 X
4,402,925 9/1983 Shinko ................ 423/290
4,500,483 2/1985 Veltri ................. 264/81

FOREIGN PATENT DOCUMENTS 58-145665 8/1983 Japan .

OTHER PUBLICATIONS

Emergent Process Methods for High-Technology Ceramics, R. F. Davis et al., (Eds.), Plenum Press, New York, 1982, pp. 347-358.

Primary Examiner—Kenneth M. Schor
Attorney, Agent, or Firm—Thiel, Boutell & Tanis Flynn

[57] ABSTRACT

A transparent BN-type ceramic material comprising 10 to 40 wt. % of boron (B), 35 to 55 wt. % of nitrogen (N) and 3 to 40 wt. % of silicon (Si) as the main component elements, and 1 to 10 wt. % of sub-component elements, with the property of not being crystallized by heat treatment at 1600° C. for one hour, and a method of producing the above ceramic material by reacting a boron-containing compound, a nitrogen-containing compound and a silicon-containing compound at deposition temperatures in a range of more than 1300° C. to less than 1700° C. with the total gas pressure within a reaction furnace maintained in the range from 10 Torr to 100 Torr by use of a chemical vapor deposition method are disclosed.

6 Claims, 2 Drawing Sheets

TRANSPARENT BN-TYPE CERAMIC MATERIAL AND METHOD OF PRODUCING THE SAME

BACKGROUND OF THE INVENTION

The present invention relates to a transparent BN-type ceramic material comprising the elements B, N, and Si, and to a method of producing the same.

Ceramic materials with superior transparency are expected to show rapid development in the future. Materials related to optical device technology, with light as the medium, are eagerly awaited. In addition, materials with the ability to transmit light and provided with the properties of ceramic, such as inherent heat resistance, corrosion resistance, heat stability and high hardness, are expected to find use in special applications in optical science, such as in various types of window materials and lenses for high temperature use. In addition, they are expected to be used as structural members for various types of equipment and devices for use in outer space.

The present invention relates to a BN-type ceramic material which is transparent and has superior heat resistance and can be used for various types of window materials for high temperature use, lenses for high temperature use, and as mask support material for X-ray lithography.

The following researches have been reported relating to ceramics containing boron (B), nitrogen (N), and silicon (Si).

K. S. Mazdiyasni and Robert Ruh <J. Am. Ceram. Soc., 64 (7) 414-19 (1981)> have reported an $Si_3N_4$-BN composite material prepared by the addition of 5 to 50% BN powder to $Si_3N_4$ powder+6% $CeO_2$ with hot-pressing. According to their report, this composite had a strength which was inferior to that of pure $Si_3N_4$, but had improved electrical properties and thermal stress resistance.

T. Hirai, T. Goto and T. Sakai <pp 347 to 358 in Emergent Process Methods for High Technology Ceramics, edited by R. F. Davis, H. Palmour and R. L. Porter, Plenum Press, New York, 1982> have reported a synthesis of an amorphous $Si_3N_4$-BN composite by chemical vapor deposition. This material was synthesized from chemical vapor deposition (CVD) of $SiCl_4+NH_3+H_2+B_2H_6$ at a total gas pressure of 30~70 Torr and at a deposition temperature of 1100°-1300° C. They reported obtaining a brown transparent deposit. They filed a Japanese patent application (Japanese patent application Laid-Open No. 58-145665) relating to the above research.

The research which is closest to the present invention is that which was reported by Hirai et al. and is found in the Japanese patent application.

In Japanese patent application Laid-Open No. 58-145665, a transparent $Si_3N_4$-BN-type amorphous material is proposed, which has high transparency, high heat stability, high thermal shock resistance and high chemical resistance. This material is an amorphous composite material comprising 30 to 70 wt. % of $Si_3N_4$ and 70 to 30 wt. % of BN, which is obtained by simultaneous deposition using a chemical vapor deposition method.

This transparent material is transparent and has a brownish color. It is obviously extremely unsatisfactory as a transparent ceramic material. This fact is stated in the above-mentioned laid-open patent application (page 4) to the effect that "As the color changes from white to yellow and to brown, the transparency improves. In the case, especially, where it exhibits a brown color externally, superior transparency is obtained." This explanation clarifies the fact even further. Specifically, the material proposed in the above mentioned patent application is not a colorless transparent material, but is a brown, transparent material. Here, "being transparent" and "being brown" are inseparably connected characteristics.

For producing the above material, a method of producing a $Si_3N_4$-BN type amorphous material is disclosed, which is characterized in that a silicon element depositing source gas, a boron element depositing source gas, and hydrogen gas together with a nitrogen element depositing source gas, are introduced separately into a furnace maintained under reduced pressure, and a chemical vapor reaction is carried out at the synthesizing temperatures of these reactive gases, which is in the range of 1100° ~1300° C., so that amorphous $Si_3N_4$ and BN are simultaneously deposited on a substrate installed in the furnace.

In the future, in the industrial fields of innovative advanced technologies, particularly in the fast developing field of optical technology, an extremely important requisite for transparent ceramic materials, which are expected to find a great many applications, is colorless transparency. Therefore, the inventors of the present invention have conducted many different types of research for the development of colorless transparent ceramics.

SUMMARY OF THE INVENTION

It is therefore an object of the present invention to provide as a colorless transparent material a novel BN-type ceramic material which is not changed in properties at a temperature of 1600° C. and which has not existed up to the present time.

DETAILED DESCRIPTION OF THE PREFERRED EMBODIMENTS

Figure 1:
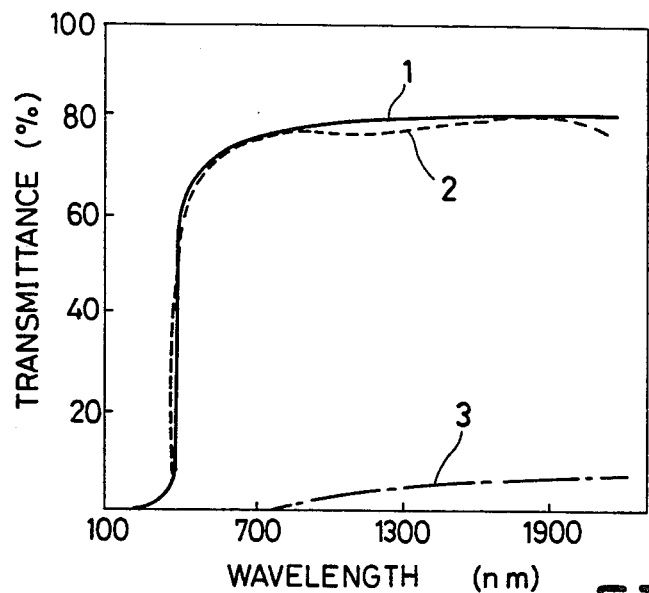
FIG. 1 and FIG. 2 show the light absorption spectra of the materials according to the present invention.

Generally, the chemical vapor deposition (CVD) process is a complicated chemical reaction process, involving many factors. In any chemical reaction, many changes occur depending on the starting materials and conditions, so the CVD process is also very individualized and characterized. The mechanism of the CVD process, apart from a small number of exceptions, is completely unexplained, and the relationship between the reaction conditions and the products of the reaction is impossible to predict or anticipate.

In the CVD, for example, when deposition temperature, total gas pressure inside the furnace, types of raw material gases and their flow rates vary, it is not unusual for the deposition state and the structure and composition of the product to completely change. This trend becomes extremely obvious, in particular, when there are many types of raw material gases. This applies to the material obtained from the three-element system which is the object of the present invention.

Under such technological circumstances, the inventors of the present invention have discovered a method of producing a colorless and transparent BN-type ceramic material which is the result of conducting detailed experimental investigations.

The present invention provides a colorless, transparent and amorphous BN-type ceramic material comprising 10 to 40 wt. % of boron (B), 35 to 55 wt. % of nitrogen (N), and 3 to 40 wt. % of silicon (Si) as the main component elements, and 1 to 10 wt. % of sub-component elements. In this material no crystallization occurs after heat treatment at 1600° C. for 1 hour.

As can be clearly seen from an examination of the mol percentage or percentage by volume of the components in the present invention, boron (B), nitrogen (N) and silicon (Si) are the main component elements. These elements mainly form a B-N bond and an Si-N bond, but all the elements do not necessarily participate in these bondings. However, because the B-N bonding is the dominant chemical bondings, the material of the present invention is referred to as a BN-type material.

A particularly preferable composition range for the component elements is 15 to 35 wt. % of boron (B), 45 to 55 wt. % of nitrogen (N), and 10 to 36 wt. % of silicon (Si).

The material of the present invention contains, in addition to boron (B), nitrogen (N) and silicon (Si), sub-component elements up to a total of 1 to 10wt. %, more preferably 1 to 5 wt. %. These may be one element, or two or more elements selected from the group consisting of C, H, O, Cl, F, Na, P, Li, Al, Zr and Ca. Among these, H, O, and Cl are particularly preferable as auxiliary elements. Details are unknown, but the existence of these sub-component elements is believed to contribute to the manifestation of colorless transparency and heat resistance in this material.

The material of the present invention is amorphous, meaning amorphous with respect to X-rays, inasmuch as a crystal peak is not observed when X-ray diffraction analysis is used.

Generally, the structure of an amorphous materials is extremely complicated. It cannot be specified by present-day technology. Accordingly, in the present invention, this amorphous structure is stipulated by the condition, "heat treatment at 1600° C. for one hour."

Because an amorphous material is in a metastable state, when subjected to heat treatment, it eventually changes to the crystalline form. However, the thermal behavior changes according to the respective structure of the amorphous materials. Accordingly, the stipulation of the behaviour manifest from the heat treatment corresponds to the stipulation of the structure.

The material according to the present invention is not crystallized on heat treatment at 1600° C. This indicated that this material is not merely a composite material formed from a simple mixture of amorphous $Si_3N_4$ and BN. It is believed that the main component elements B, N and Si are formed into a complicated microscopic structure at the elemental or molecular level, and in addition, the structure becomes even more complicated because of the contribution of the sub-component elements.

The material according to the present invention is transparent. A small amount of coloration may result from the presence of impurities, but brown coloration is completely absent. It is essentially colorless and transparent. This fact is illustrated in a later described example of the present invention, in which it is confirmed that, within the visible light region, the material of the present invention exhibits a superior transparency. Specifically, the light transmittance measured with a spectrophotometer in a 0.70 mm thick plate-shaped sample of the material of the present invention is 50% or more at 400 nm (wavelength), and 60% or more at 450 nm (wavelenth).

In the present invention, heat treatment was carried out at 1600° C. within a flow of high purity argon (Ar) or nitrogen ($N_2$) gas. An X-ray diffraction measurement was performed on a powdered sample of the material after pulverizing, and on a plate-shaped sample, and the presence or absence of an diffraction peak was investigated with an X-ray diffraction apparatus (for example, a Geiger Flex 2013, made by Rigaku Denki Co., Ltd.). When no crystalline peak, other than a broad diffraction peak characteristic of an amorphous material or a diffraction peak characteristic of a turbostatic BN is observed, it was judged in the present invention that the material "reveals no crystallization."

It is preferable that the density of the material of the present invention be within the range of more than 1.5 $g/cm^3$ and less than 3.2 $g/cm^3$, more preferable within the range of more than 1.7 $g/cm^3$ and less than 2.3 $g/cm^3$.

One example of a method of producing a colorless, transparent BN-type ceramic material of the present invention is as follows:

When using the chemical vapor depostion method, a substrate of the desired shape, made from, for example, graphite or molybdenum, is installed within a vacuum furnace and is heated to 1400 to 1600° C. Then a boron (B) source gas such as $BCl_3$, nitrogen (N) source gas such as $NH_3$, and a silicon (Si) source gas such as $SiCl_4$, is blown onto the above-mentioned substrate, using hydrogen as a carrier gas, to form the compound according to the present invention, while holding the total gas pressure in the furnace at about 30 Torr.

There is also the case where photoinduced CVD is used employing a beam, such as a laser beam, or a plasma CVD employing high frequency wave or microwaves is used. In the case where gases containing a sub-component element are not used as a raw material, a small amount of $BF_3$, $H_2$, $CO_2$ or chlorides such as $SiCl_4$ is added.

The material of the present invention is usually obtained by means of a chemical vapor deposition method such as the method described above. In addition to this, so-called physical vapor phase deposition methods, such as vacuum evaporation method, ion beam method and sputtering method can be employed. Moreover, a powder sintering method can also be employed, in which an amorphous ultrafine powder is employed. The amorphous ultrafine powder is prepared by gas phase method or by liquid phase method such as sol-gel method.

The present invention also provides an improved method of producing a colorless, transparent BN-type ceramic material. Specifically, it is directed to a method of producing a transparent BN-type ceramic material comprising B, N and Si as the main component elements, in which a boron-containing compound, a nitrogen-containing compound and a silicon-containing compound are used in a chemical vapor deposition method, with the deposition temperature maintained in the range of more than 1300° C. its less than 1700° C., and the total gas pressure maintained in the range between 10 Torr and 100 Torr during the deposition.

As mentioned above, in order to produce a colorless and transparent material of the present invention, the deposition temperature is maintained in the range of more than 1300° C. to less than 1700° C. and the total gas pressure is maintained in the range between 10 Torr and 100 Torr. When the deposition temperature is 1300° C. or less, a product containing an intermediate is easily produced and superior transparence is not obtained. On the other hand, at deposition temperatures of 1700° C. or more, a material with reduced light transmittance is obtained, probably because of the growth of crystals. The preferable deposition temperature lies between 1350° C. and 1550° C. , in which range it is possible to produce a superior material with excellent light transmittance in a good yield. The above depostion temperature is measured at the surface of the material deposited on the substrate, using a two-color pyrometer.

The total gas pressure within the furnace is between 10 Torr and 100 Torr, but, to obtain a material with superior transparence, the preferable range is between 20 Torr and 60 Torr. The optimum pressure is about 30 Torr.

The outline of the method of producing the material according to the present invention is as follows.

A substrate of a desired shape, made of graphite, a heat resistant metal (tungsten, molybdenum, tantalum, etc.), or a heat resistant ceramic (SiC, $TiB_2$, etc.), is installed within a heating vacuum furnace and heated to a predetermined temperature of more than 1300° C. to 1700° C. Then, a gas comprising a boron-containing compound, a nitrogen-containing compound, a silicon-containing compound, and a carrier or diluting gas is blown onto the substrate to deposit on the substrate a BN-type material containing B, N, and Si as its component elements. The transparent BN-type material is then obtained by stripping the deposited material from the substrate.

The present invention is not limited to the chemical vapor deposition method using a substrate. Also, the materials from which the substrate is formed are not limited to the materials stated above. The method of the present invention is suitably applicable to any generally-used chemical vapor deposition method and its apparatus.

As boron-containing compounds, halides such as $BCl_3$, $BF_3$, hydrides such as $B_2H_4$, $B_{10}H_{14}$, borazine and chlorinated borazine, which contain nitrogen, can be used. $BCl_3$ is particularly preferable for use in the present invention. A superior colorless and transparent material is easily obtained when this compound is used.

As a nitrogen-containing compound, $NH_3N_2$ and urea derivatives can be used. $NH_3$ is the most preferable for use in the present invention. As a silicon-containing compound, for example, $SiCl_4$, $SiH_4$ and $Si(CH_3)_2Cl_2$ can be used. $SiCl_4$ is particularly preferable for use in the present invention. As a carrier or diluting gas, $H_2$, $N_2$ or inert gases such as Ar can be used. The flow rate of the carrier or diluting gas is usually in the range of 1/10 to 100 of the total flow rate of the boron-, nitrogen- and silicon-containing compounds.

In the present invention, a superior transparent material is readily obtained by the CVD of a $BCl_3$-$NH_3$-$SiCl_4$-$H_2$ gas system, so these are the most preferable raw materials. In this case, for reasons that are yet unknown, when the ratio of the $SiCl_4$ gas flow rate to the sum of the $BCl_3$ gas flow rate and the $SiCl_4$ gas flow rate, i.e., $FR(SiCl_4)/[FR(BCl_3)+FR(SiCl_4)]$, is taken as the X-coordinate, and the deposition temperature ($T_{dep}$, °C.) as the Y-coordinate, the production process carried out in the region enclosed by point A (0.50, 1500), point B (0.19, 1400), point C (0.67, 1400) and point D (0.67, 1500) provides the best deposits.

In implementing the method according to the present invention it is extremely important that the interior of the CVD furnace be kept clean. It is desirable that any material adhering to the inside of the furnace be as far as possible removed. This adhering material readily absorbs the moisture in the air when the furnace is opened to replace the substrate or remove the deposit. As a result, this absorbed water is gradually released into the furnace and can have an adverse effect on the production of a good deposition. In the deposition process, for instance, cracks could be created throughout the deposition, so that the problem that the deposition is locally peeled off the substrate is readily produced.

The elemental analysis of boron, nitrogen and silicon in the present invention is performed in the following manner.

The quantification of boron (B) was performed by subjecting the sample to alkali fusion, using a platinum crucible with sodium carbonate as a flux, followed by neutralization titration thereof.

In the chemical analysis for nitrogen (N), the sample was decomposed by acid decomposition, using a mixture of hydrofluoric acid and hydrochloric acid and a high pressure decomposition crucible made of Teflon (Trademark), followed by separation by distillation and neutralization titration thereof.

For silicon (Si), the sample was decomposed by alkali fusion, using a platinum crucible with sodium carbonate as a flux, and the quantification was performed by inductively coupled plasma atomic emission spectrochemical analysis.

Qualitative analysis for the sub-component elements is performed using an ion microprobe mass analyzer for H, F, Cl and O. Other elements are analyzed using the emission spectrochemical analysis. The value obtained by subtracting the quantitative value for B, N, and Si from the gross weight of the total sample is the total weight of the included sub-component elements.

EXAMPLE 1

$BCl_3$, $NH_3$ and $SiCl_4$ were used as the raw material gases, and $H_2$ as the carrier gas. A transparent ceramic material was synthesized by the chemical vapor deposition method on a graphite substrate. The flow rate for each gas were as follows:

| | |
|---|---|
| $BCl_3$ | 50 SCCM |
| $SiCl_4$ | 90 SCCM |
| $NH_3$ | 90 SCCM |
| $N_2$ | 670 SCCM |

These gases were fed into a reaction furnace which had first been evacuated, and were blown onto the graphite substrate which had been heated to 1500° C., so that a ceramic material was deposited on the substrate. The deposition time was two hours, and the pressure inside the reaction furnace was maintained at 30 Torr. After the deposition was completed, the feed of the gases was terminated and the remaining gases were evacuated, after which the substrate was cooled almost to room temperature. Air was then flown into the reaction furnace and the substrate was removed.

The deposited material was then stripped from the substrate. This material was colorless and transparent.

An X-ray analysis of the deposited material showed only the broad diffraction peak characteristic of a turbostratic BN.

A quantitative analysis of the elements B, N, and Si showed that the contents were B : 20 wt. %; N : 46 wt. %; and Si : 30 wt. %. The sub-component elements totalled 4 wt. %. A qualitative analysis of the material by Ion Microprobe Mass Analyzer showed that H, Cl and O elements were present.

The bulk density of the deposited material was 2.1 g/cm$^3$ and its Vicker's microhardness was 1000 kg/mm$^2$.

The light absorption spectrum in the ultraviolet, visible, and near infrared regions (thickness 0.76 mmt) is shown by Curve 1 in the graph of FIG. 1. The light transmittance was 57% at 400 nm, and 68% at 450 nm.

In addition, when X-ray diffraction measurement was again carried out after the sample had been heat-treated at 1600° C. for one hour within a flow of high purity Ar gas, no new diffraction peak were observed. Also, as shown in Curve 2 in FIG. 1, absolutely no change was observed in the light absorption spectrum.

For comparison, when the sample was subjected to heat treatment at 1700° C. for one hour, a diffraction peak characteristic of $\beta$-Si$_3$N$_4$ was observed, and a brown coloration appeared in the sample. As indicated by Curve 3 in FIG. 1, the transparency declined to a large degree.

EXAMPLE 2~8

Under the same procedure as in Example 1, the deposition was carried out at 1400° to 1500° C., and the flow rate of the BCl$_3$ and SiCl$_4$ gases was varied, so that materials of different compositions were produced.

The results of the elemental analysis of the thus obtained materials and the densities thereof are given in Table 1. A qualitative analysis of the sub-component elements by use of Ion Microprobe Mass Analyser indicated the presence of H, Cl and O. The sub-component elements totalled 1.2 to 2.9 wt. % for Materials Nos. 2 to 7 in Table 1, and 6.2 wt. % for Material No. 8. All the materials produced were colorless, transparent plates. An X-ray diffraction analysis showed them to be in amorphous state. In addition, when an X-ray diffraction analysis was carried out again after the sample had been heat-treated at 1600° C. for 1 hour, no crystallization was recognized. The densities of the plate samples were measured by the Archimedean method with immersion in toluene.

TABLE 1

| No. | Contents (wt. %) B | N | Si | Density (g/cm$^3$) |
|---|---|---|---|---|
| 2 | 15.7 | 47.5 | 35.6 | 2.27 |
| 3 | 21.0 | 49.4 | 28.4 | 2.02 |
| 4 | 23.4 | 50.1 | 23.8 | 1.91 |
| 5 | 25.3 | 50.8 | 21.6 | 1.89 |
| 6 | 32.3 | 53.7 | 11.6 | 1.74 |
| 7 | 35.7 | 52.3 | 9.1 | 1.73 |
| 8 | 36.8 | 52.1 | 4.9 | 1.54 |

EXAMPLES 9~12

A sample was deposited on a graphite substrate by use of a CVD apparatus of the type of transmitting an electric current through the substrate. NH$_3$, BCl$_3$ and SiCl$_4$ were used as the raw material gases, and H$_2$ as the carrier gas. The temperature of the substrate was measured by a two-color optical pyrometer.

First, the substrate was set, and the CVD apparatus was evacuated. The substrate was then heated to a predetermined temperature. The reaction gases and the carrier gas were introduced to the CVD apparatus, so that the deposition was carried out at a predetermined pressure. After the deposition was completed, the deposited material was peeled off the substrate and its density was measured by the Archimedean method. Then the sample plate was cut and the thickness measured by a traveling microscope. The amount of silicon contained was measured by chemical analysis. The transparency was then quantitatively determined by measuring the light transmittance in the range from 200 nm to 2200 nm, using a spectrophotometer.

A superior transparent material could not obtained at temperatures below 1300° C. When tests were made at 1750° C., a brown-colored, non-transparent material was obtained. At pressures below 10 Torr, the material became slightly opaque with a milky color, and the transparency was reduced. At pressures higher than 100 Torr, the products from side reactions increased excessively, so that a superior transparent material was not obtained.

Figure 2:
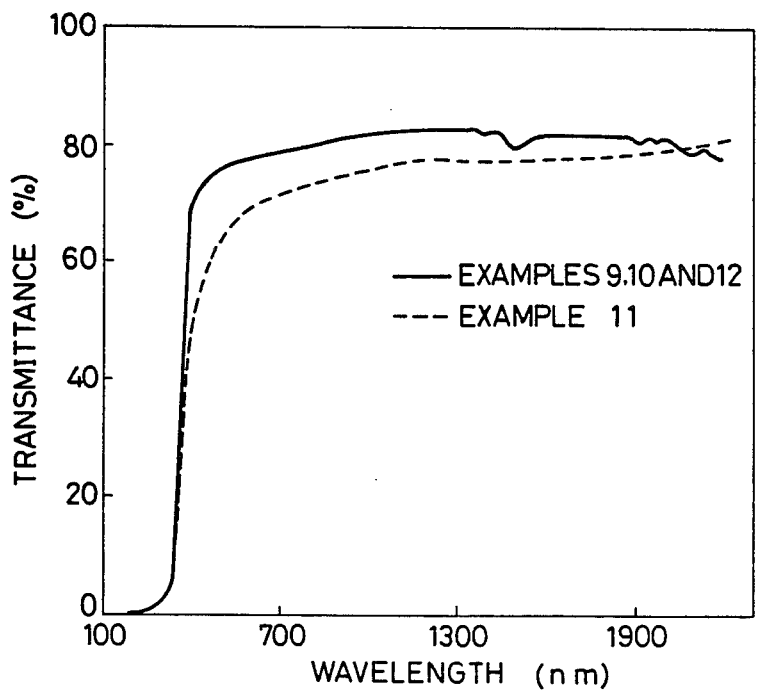

Tables 2 and 3 show the results of the experiments on the Examples in which ceramic materials having superior transparency were obtained. In examples 9, 10 and 12, the transmittance increased from 0% to 75% in the range from 200 nm to 600 nm. In a wavelength range of more than 600 nm up to 2200 nm, the transmittance was 80% to 85%. The transmittance was 70% at a wave length of 400 nm, and 76% at 450 nm. These are shown in FIG. 2. In Example 11, the transmittance was slightly lower than those of the other examples. This is also shown in FIG. 2.

TABLE 2

| | Experimental Conditions | | | | | | |
|---|---|---|---|---|---|---|---|
| Examples | Flow Rate of Gases (SCCM) | | | | Temperature (°C.) | Pressure (Torr) | Time (h) |
| | NH$_3$ | BCl$_3$ | H$_2$ | SiCl$_4$ | | | |
| 9 | 90 | 50 | 670 | 90 | 1400 | 30 | 4 |
| 10 | 90 | 70 | 670 | 70 | 1500 | 30 | 4 |
| 11 | 90 | 50 | 670 | 90 | 1400 | 10 | 6 |
| 12 | 90 | 50 | 670 | 90 | 1400 | 60 | 1 |

TABLE 3

| | Results | | | |
|---|---|---|---|---|
| Examples | External Appearance | Thickness (mm) | Density (g/cm$^3$) | Si Content (wt. %) |
| 9 | Transparent | 1.0 | 2.05 | 30 |
| 10 | Transparent | 1.0 | 1.89 | 22 |
| 11 | Transparent | 0.75 | 1.78 | 16 |
| 12 | Transparent | 0.25 | 2.25 | 35 |

EXAMPLE 13

Under the same procedure as in Examples 9~12, a sample was deposited on a graphite substrate using a CVD apparatus of the type of transmitting an electric current through the substrate. The deposition temperatures were 1400° C., 1500° C. and 1600° C. The deposition pressure was 30 Torr. BCl$_3$, NH$_3$, SiCl$_4$ and H$_2$ were used. The flow rates of NH$_3$ and H$_2$ were respectively 90 SCCM and 670 SCCM. BCl$_3$ and SiCl$_4$ were fed at a combined flow rate of 140 SCCM. The ratio of the SiCl$_4$ flow rate to the sum of the BCl$_3$ and SiCl$_4$ flow rates was varied. The raw material gases were fed into the CVD apparatus through a double tube nozzle, with the $NH_3$ in the inner tube, and the $BCl_3$, $SiCl_4$ and $H_2$ in the outer tube.

Figure 3:
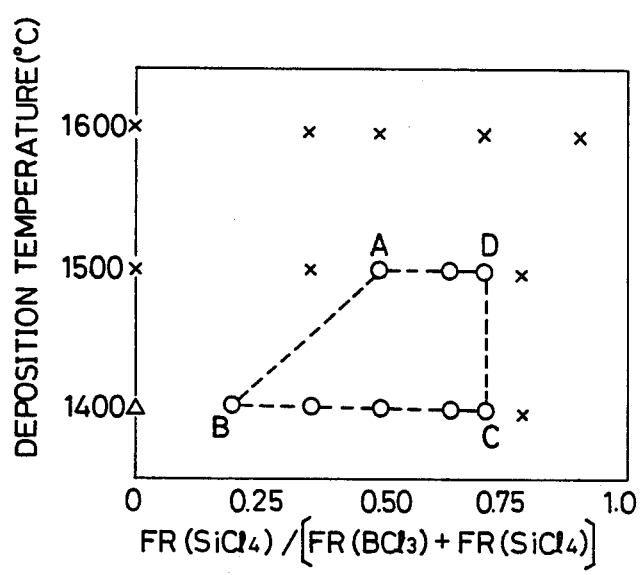
FIG. 3 shows the most preferable conditions for synthesizing the material according to the present invention.

The deposition time ranges from 2 to 5 hours. The deposited sample was peeled off the substrate and the transparency evaluated visually. These results are shown in FIG. 3. In the graph in FIG. 3 the circles indicate a colorless, transparent deposition, and the X marks indicate opaque materials. A triangle indicates a deposition which is inferior in moisture resistance. This graph clearly shows that a BN-type ceramic material with superior transparency was obtained within the quadrilateral formed with the points A (0.50, 1500), B (0.19, 1400), C (0.67, 1400), and D (0.67, 1500) as its corners.

The present invention provides a colorless transparent ceramic material which has superior heat resistance. It can be used as a material in optical device technology using light as transmission medium, for all types of window materials for high temperature use, and in high temperature lenses. It is a novel material which can have many practical applications, not just by itself, but also combined with metals, other ceramics and polymers.

What is claimed is:

1. A method of producing a colorless and transparent BNtype material comprising 10 to 40 wt. % of boron (B), 35 to 55 wt. % of nitrogen (N) and 3 to 40 wt .% of silicon (Si) and 1 to 10 wt .% of one or more subcomponent elements selected from the group consisting of C, H, O, Cl, F, Na, P, Li, Al, Zr and Ca, in an amorphous state, said material having the property of not being crystallized by heat treatment at 1600° C. for one hour, said method comprising: in a reaction furaace, reacting $SiCl_{14}$ gas, $BCl_3$ gas and $NH_3$ gas by a chemical vapor deposition method, with the total gas pressure within said reaction furnace being maintained in the range of from 20 Torr to 60 Torr, and thereby depositing said colorless and transparent BN-type material in an amorphous state onto a substrate, wherein when the ratio of the flow rate of said $SiCl_4$ gas to the sum of the flow rates of said $BCl_3$ gas and said $SiCl_4$ gas, that is, the ratio of $[FR(SiCl_4)+FR(BCl_3)]$, is taken as the X-coordinate and the temperature ($T_{dep}$,°C.) of said substrate is taken as the Y-coordinate of an XY coordinate graph, said chemical gas phase deposition method is carried out under conditions on or within the quadrilateral area in said XY coordinate graph enclosed by straight lines joining point A (0.50, 1500) to point B (0.19, 1400), point B to point C (0.67, 400), point C to point D (0.67, 1500) and point D to point A, and the flow rate of the $NH_3$ gas is 90 SCCM.

2. The method of producing a transparent BN-type material of claim 1, wherein said chemical vapor deposition method further employs a carrier gas.

3. The method of producing a transparent BN-type material of claim 2, wherein said carrier gas is hydrogen ($H_2$) and the flow rate of $H_2$ is 670 SCCM.

4. A method of producing a colorless, transparent, amorphous, BN-type material consisting essentially of from 10-40 wt. % of boron, from 35 to 55 wt. % of nitrogen, from 3 to 40 wt. % of silicon and from 1 to 10 wt .% of one or more elements selected from the group consisting of C, H, O, Cl, F, Na, P, Li, Al, Zr and Ca, said material having a density of greater than 1.5 g/cm$^3$ and less than 3.2 g/cm$^3$, said material exhibiting no crystallization when heated at 1600° C. for one hour, which comprises the steps of: flowing $SiC_4$ gas, $BCl_3$ gas and $NH_3$ gas against a substrate in a reaction furnace, wherein the pressure in said furnace is from 20 to 60 Torr and the temperature of said substrate is from 1400° to 1500° C., so that when the ratio of $FR(SiCl_4)/[FR(BCL_3)+FR(Si Cl_4)]$ is taken as the X-coordiante and the temperature of the substrate is taken as the Y-coordinate on an XY coordinate graph, the values of X and Y lies on or inside the quadrilateral area defined by straight lines connecting point A (0.50,1500) to point B (0.19, 1400), point B to point C (0.67, 1400), point C to point D (0.67,1500) and point D to point A, wherein $FR(SiCl_4)$ is the flow rate of $SiCl_4$ gas and $FR(BC_3)$ is the flow rate of $BCl_3$ gas, and thereby forming said material and depositing it on the substrate; then stripping said material from the substrate.

5. A method which comprises reacting $SiCl_4$ gas, $BCl_3$ gas and $NH_3$ gas in a reaction furnace at a pressure of from 20 to 60 Torr under chemical vapor deposition conditions employing a substrate, wherein the flow rate of the $SiCl4$ gas [$FR(SiCl_4$ and the flow rate of the $BCl_3$ gas [$FR(BCl_3$ )]are such that when the ratio of $FR(SiCl_4)/[FR(BCl_3$ plug $FE(SiCl_4)]$ is taken as the X-coordinate and the temperature of the substrate is taken as the Y-coordinate on an XY coordinate graph, the values of X and Y lie on or inside the quadrilateral area defined by straight lines connecting point A (0.50, 1500) to point B (0.19,1400), point B to point C (0.67,1400), point C to point D (0.67,1500) and point D to point A and the amounts of $SiCl_4$, $BCl_3$ and $NH_3$ gas reacted in said furnace are effective to form a colorless, transparent, amorphous, BN-type material consisting essentially of from 10 to 40 wt. % of boron, from 35 to 55 wt. % of nitrogen, from 3 to 40 wt. % of silicon and from 1 to 10 wt. % of one or more elements selected from the group consisting of H, O, Cl, said material exhibiting no crystallization when heated at 1600° C. for one hour, "said chemical vapor deposition conditions being maintained for sufficient time to deposite said material on said substrate".

6. A method as claimed in claim 5 in which the ratio of (1) the sum of the flow rates of $SiCl_4$ gas and $BCl_3$ gas to (2) the flow rate of the $NH_3$ gas is 140/90.

* * * * *

UNITED STATES PATENT AND TRADEMARK OFFICE
CERTIFICATE OF CORRECTION

PATENT NO. : 4 772 304
DATED : September 20, 1988
INVENTOR(S) : Hiroyuki NAKAE et al It is certified that error appears in the above-identified patent and that said Letters Patent is hereby corrected as shown below:

Column 9, line 28; change "BNtype" to ---BN-type---.
line 35; change "furaace" to ---furnace---.
line 36; change "$SiCl_{14}$" to ---$SiCl_4$---.
line 44; change "+FR($BCl_3$)" to ---+FR($BCl_3$)]---.
line 51; change "400" to ---1400---.
Column 10, line 13; change "$SiC_4$" to ---$SiCl_4$---.
line 25; change "FR($BC_3$)" to ---FR($BCl_3$)---.
line 33; change "SiC14" to ---$SiCl_4$---.
change "[FR($SiCl_4$"  to ---[FR($SiCl_4$)]---.
line 35; change "FR($SiCl_4$)/[FR($BCl_3$ plug FE($SiCl_4$)] to ---FR($SiCl_4$)/[FR($BCl_3$) plus FR($SiCl_4$)]---.

Signed and Sealed this

Thirteenth Day of June, 1989

Attest:

DONALD J. QUIGG

*Attesting Officer*    *Commissioner of Patents and Trademarks*